United States Patent [19]

Chu et al.

[11] Patent Number: 5,269,372

[45] Date of Patent: Dec. 14, 1993

[54] INTERSECTING FLOW NETWORK FOR A COLD PLATE COOLING SYSTEM

[75] Inventors: Richard C. Chu; Michael J. Ellsworth, Jr.; Robert E. Simons, all of Poughkeepsie; David T. Vader, New Paltz, all of N.Y.

[73] Assignee: International Business Machines Corporation, Armonk, N.Y.

[21] Appl. No.: 47,763

[22] Filed: Apr. 15, 1993

Related U.S. Application Data

[63] Continuation of Ser. No. 994,581, Dec. 21, 1992, abandoned.

[51] Int. Cl.$^5$ .................. F28F 7/00; H01L 23/473
[52] U.S. Cl. .................. 165/80.4; 165/185; 361/699; 257/714
[58] Field of Search .............. 165/80.4, 80.5; 357/82, 357/83; 361/382, 385; 257/714

[56] References Cited

U.S. PATENT DOCUMENTS

| | | | |
|---|---|---|---|
| 3,361,195 | 1/1968 | Meyerhoff et al. | 165/80.4 |
| 4,034,468 | 7/1977 | Koopman | 29/628 |
| 4,072,188 | 2/1978 | Wilson et al. | 165/80.4 |
| 4,138,692 | 2/1979 | Meeker et al. | 257/714 |
| 4,748,495 | 5/1988 | Kucharek | 257/714 |
| 4,758,926 | 7/1988 | Herrell et al. | 361/385 |
| 4,920,574 | 4/1990 | Yamamoto et al. | 361/385 |
| 5,088,005 | 2/1992 | Ciaccio | 361/385 |
| 5,099,311 | 3/1992 | Bonde et al. | 257/714 |
| 5,168,348 | 12/1992 | Chu et al. | 257/714 |

OTHER PUBLICATIONS

R. C. Chu et al, "Fluidized Thermal Interface", IBM Tech. Discl. Bulletin, vol. 23, No. 2, Jul. 1980, pp. 700–701.

Primary Examiner—John Rivell
Assistant Examiner—L. R. Leo
Attorney, Agent, or Firm—Lawrence D. Cutter

[57] ABSTRACT

A cold plate for cooling electronic modules and devices is disclosed which incorporates an intersecting flow network. The flow network is designed and devised such that flow paths are arranged in a rectilinear fashion surrounding blocks of material which act as heat sinks. Supply conduits and return conduits for supplying and returning cooling fluid are disposed orthogonally to the flow directions within the flow paths and such that each supply channel is circumscribed by a plurality of return channels, and each return channel is circumscribed by a plurality of supply channels. The arrangement of the supply and return channels insures the shortest possible flow path for the cooling fluid thereby insuring maximum cooling efficiency and minimizing and localizing the temperature rise in the cooling fluid during passage from the supply conduit to the return conduit. With a minimum temperature rise of the cooling fluid over a short flow path, conduction in the cold plate insures optimum uniformity of cooling to the electronic components. The components of the cold plate either may be assembled and clamped or may be rigidly affixed to one another by means of either soldering or braising to form the structure defining the flow channels, conduits and manifold connections necessary for the consistent and uniform circulation of the cooling fluid.

15 Claims, 4 Drawing Sheets

INTERSECTING FLOW NETWORK FOR A COLD PLATE COOLING SYSTEM

This is a continuation of copending application Ser. No. 07/994,581, filed on Dec. 21, 1992, now abandoned.

FIELD OF THE INVENTION

This invention relates to devices for cooling electronic components, and more specifically to a cold plate used to cool and maintain electronic components at a cold and constant operating temperature.

RELATED INVENTION APPLICATION

This application is related to an invention disclosed in application Ser. No. 994,389, filed Dec. 21, 1992, on even date herewith, entitled "Topology Matched Conduction Cooling Module", by Richard C. Chu, et al., and commonly assigned herewith.

The flow network disclosed herein may be advantageously embodied in the conduction cooling module and particularly in the cold plate of the related application identified above; the topology matching feature of the related application may be advantageously embodied in a cold plate which has the flow network described herein.

BACKGROUND OF THE INVENTION

As computers increase in performance and capability, the cooling of the electronic modules contained therein becomes more difficult. Cooling of the electronic modules is necessary for high speed operation of the electronics and additionally for sustained reliable operation of the electronics. The cooler the modules are maintained, the higher the operating speeds and reliability obtainable during such operations. As the temperature of the electronic modules increases device switching times accordingly increase and slow the operation of the circuits contained in these modules as well as thermally stress the modules to the point where reliability may suffer. In cooling the electronic modules within the computer it is desirable, if not absolutely necessary, to maintain uniformity of temperature so that interconnected electronic modules may operate at substantially the same speed and thereby not create operational mismatches which result from thermal mismatches.

Uniformity of cooling of the electronic modules is difficult to obtain. Non-uniformity problems may result from the fact that as a cooling fluid flows from one location to another over a surface, thereby absorbing the heat from that surface, the temperature of the cooling fluid inherently will rise. As the temperature of the cooling fluid rises, the differential temperature diminishes between the cooling fluid and the surface over which it flows. With a diminished differential temperature, the heat transfer from the hot surface to the cooling fluid is reduced, thereby resulting in warm or hot spots near the end of the cooling fluid flow path. Moreover, cooling efficiency degrades substantially with longer flow paths which only exacerbates the problem of hot spots at the warm end of the flow path. Hot spots occur within the cold plate which in turn will result in inadequate cooling of the electronic modules and inherently will create substantial temperature differentials between electrically interconnected electronic modules; accordingly, with such thermal mismatches, mismatches in performance may occur.

Past efforts to cool a plate by bathing one entire surface of the plate with a cooling fluid resulted in uncontrolled flow of the coolant; where the flow is not uniform over the surface of the plate, temperature inequality occurs with warm or hot spots developing in areas of inadequate coolant flow.

Further where only a single planar surface is cooled by the flow of a cooling fluid, the heat transfer to the cooling fluid across this single surface may be insufficient to maintain the electronic modules at desired or optimal temperatures.

OBJECTS OF THE INVENTION

It is an object of the invention to improve the cooling of electronic components during operation.

It is another object of the invention to cool the electronic components uniformly to maintain uniform and reliable performance of the electronic circuits contained therein.

It is still another object of the invention to reduce coolant flow to short flow path lengths and to maintain a constant flow resistance for flow control.

It is a further object of the invention to insure spatial uniformity in the temperature of the electronic components.

It is an additional object of the invention to improve the heat transfer from the cold plate to the cooling fluid by control of the flow characteristics of the cooling fluid.

It is still a further object of the invention to reduce the pressure drops between the inlet and outlet of the cooling module, thereby providing relatively free flow of the cooling fluid over the cooling surfaces.

SUMMARY OF THE INVENTION

The disadvantages of the prior art are overcome and the objects of the invention accomplished by incorporating the features and aspects of the invention as described in summary form.

A plate of some substantial thickness is formed of a thermally conductive material, preferably a metal such as copper, and is cut by any acceptable cutting technique such as gang sawing or EDM (Electronic Discharge Machining) to remove portions of the plate and form kerfs. A first plurality of kerfs is cut into but not extending completely through the plate, thereby forming a series of parallel channels or grooves. Thereafter, a second plurality of kerfs is similarly formed lying perpendicular to the first plurality of kerfs and intersecting with the first plurality of kerfs to form and leave blocks of the plate material; each block is surrounded by kerfs on four sides thereof and attached at a bottom face to the plate.

At each junction where kerfs intersect, blind holes are drilled to enlarge the junctions. The blind holes extend for a depth substantially corresponding to the depths of the kerfs which intersect at that point. The blind holes provide conduits coaxial with the axis of the intersection and of a size sufficiently large to provide a low pressure flow to the several kerfs or channels. Alternatively, the blind holes collect fluid from the several kerfs or channels which terminate at the blind hole and permit relatively unimpeded flow from the blind hole to the return fitting of the cold plate.

A manifold is supplied and placed over the kerfs and the conduits to communicate with and define flow paths between the supply or inlet fittings and the supply conduits. Similarly, the manifold is disposed between the return conduits and the return fittings to distribute the fluid upon entry into the manifold and to collect the fluid after it has passed through the flow channels and absorbed the heat from the cooling plate.

Flow on the four sides of a block of material substantially increases the heat transfer because the area of engagement is dramatically increased between the block material and the cooling fluid as well as the fact that with judicious arrangement of the supply and the return conduits, the length of the flow in any kerf or channel is limited to the length of one side of one of the blocks formed by the kerfs. In order to judiciously position the supply and the return conduits for a maximum cooling efficiency and for minimum flow length, each supply conduit is positioned so that it is surrounded or circumscribed by return conduits. A single supply conduit will provide cooling fluid to two to four flow channels. Each of these flow channels terminates in a return conduit which collects fluid from two to four supply conduits. The supply and return conduits are positioned alternatively along a single kerf. Alternating supply and return conduits along adjacent parallel kerfs and staggering them so that a supply conduit only communicates with return conduits through interconnecting kerfs establishes short flow paths. The short flow paths localize the differential temperature of the coolant as measured between the supply conduit and the return conduit. By localizing the temperature differential between the supply and return conduits, a significantly more uniform temperature may be obtained for all electronic modules cooled by the cold plate.

Short flow channels exhibit a higher cooling efficiency than longer flow channels. The short flow paths terminate before the cooling efficiency drops with flow channel length.

A more thorough and detailed understanding of the invention may be obtained by reference to the drawings and the detailed description of the best mode of the preferred embodiment which follows.

DRAWINGS

DETAILED DESCRIPTION OF THE PREFERRED EMBODIMENT OF THE BEST MODE FOR CARRYING OUT THE INVENTION AS CONTEMPLATED BY THE INVENTORS

Figure 1:
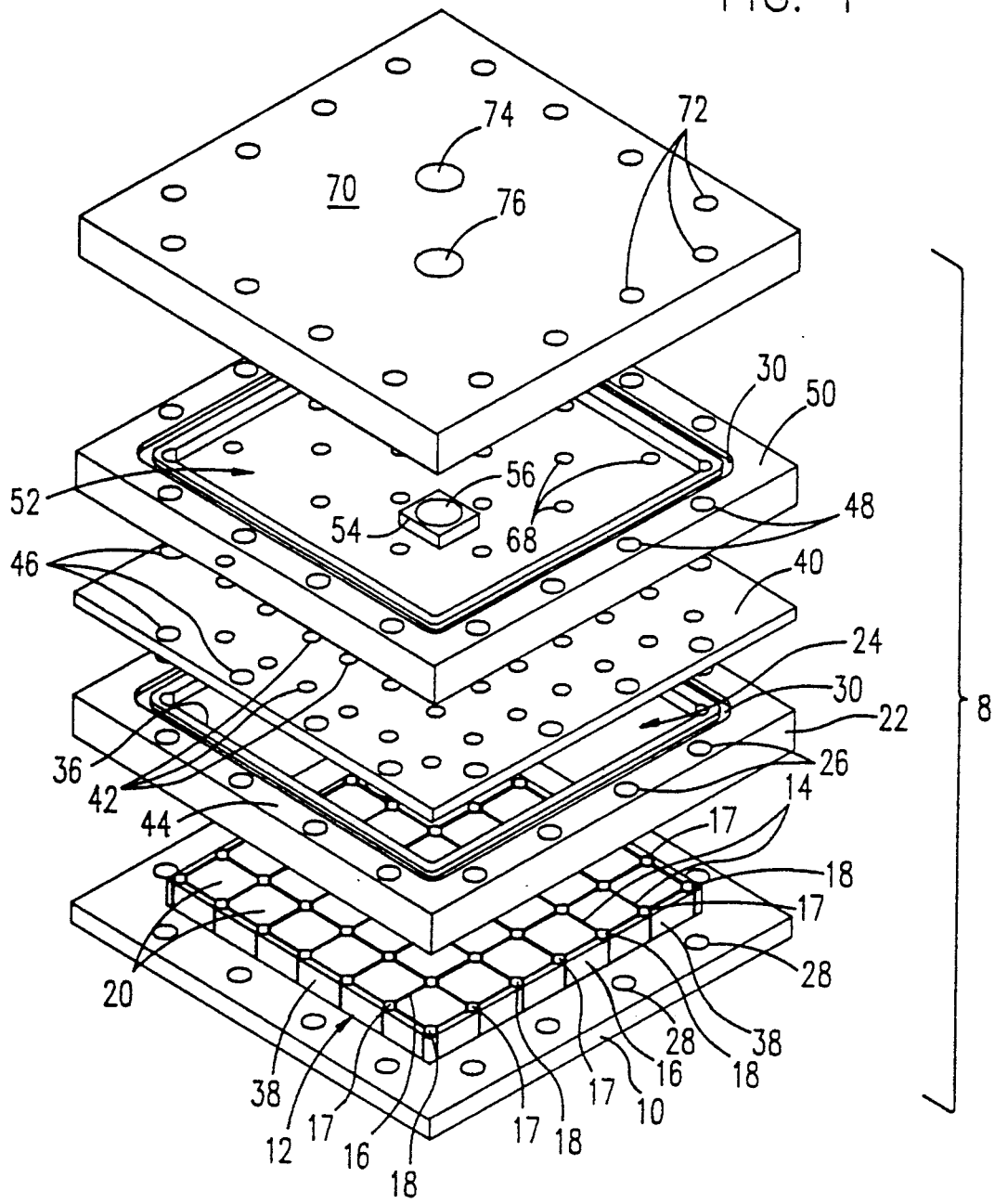
FIG. 1 is an exploded view of a cold plate assembly fabricated in accordance with the invention.

With reference now to FIG. 1, a plate 10 or plate-like member 10 may be formed and provided with a raised central portion 12 or pedestal 12. The preferred approach is to utilize a single plate 10, preferably copper, and to mill the outer periphery leaving a thicker portion or pedestal 12 in the central region of one surface of plate 10. A plurality of kerfs 14 is formed into the pedestal 12 of plate 10 either by gang sawing or by the use of electronic discharge machining techniques, hereinafter referred to as EDM. Intersecting kerfs 16 are formed in the same manner to intersect at substantially 90° angles with kerfs 14. The kerfs 14, 16 are relatively narrow in width and extend through substantially the entire height of the pedestal 12. The height of pedestal 12 is preferably such that the pedestal 12 is comprised of cubes, with four sides of each cube defined by the kerfs 14, 16.

At the intersections of kerfs 14 and 16, blind holes 18 are drilled to enlarge the intersection of kerfs 14 and kerfs 16 forming conduits 17, 18. With kerfs 14 and 16 formed, blocks 20 remain as defined by the connecting kerfs 14, 16 surrounding each block 20.

Framing plate 22 is provided with a central aperture 24. Clamping holes 26 are likewise provided in alignment with holes 28 of plate 10. Plate 22 is further provided with a channel 30 for the insertion of an O-ring 32. A similar O-ring 32 seal arrangement is provided on the underside of plate 22, as is best observed in FIG. 2. Interior walls 36, define opening 24 in plate 22 and closely engage the exterior surfaces 38 of pedestal 12 on all sides. The close engagement between surfaces 36 and surfaces 38 act to substantially seal or restrict the short remaining portions of kerfs 14 and 16 which extend outwardly through the periphery of pedestal 12 from supply conduits 17 and return conduits 18. The clearance between surfaces 36 and 38 is sufficiently small that no significant flow of cooling fluid occurs in that gap; and any which does occur will be collected by return conduits 18. Plate 22 is dimensioned in thickness to correspond to the height of pedestal 12 from the top surface of plate 10 such that surface 44 of plate 22 and the tops of blocks 20 or co-planar, or slightly thicker to accommodate seal plate 40 as described below.

Overlying the blocks 20 and surface 44 of plate 22 is seal plate 40. Sealing plate 40 acts to terminate the upper portion of kerfs 14 and 16, forming channels between the blocks 20, plate 10 and the engaging surface of seal plate 40. Plate 40 is provided with a plurality of holes 42 extending through plate 40 which are spatially disposed to correspond to and communicate with the conduits 17 and 18. Plate 40 may be provided with a polymeric coating having resilience such that when it is clamped into position it provides a seal between plate 40 and the blocks 20 formed from pedestal 12. Alternatively, plate 40 and blocks 20 may be precoated with a solder and then subsequently reflow soldered, joining plate 40 to the top of blocks 20. In the event that the plate 40 is soldered to the blocks 20 or adequately sealed by compression, there would be no need for clamping holes 46 on the periphery of plate 40 and plate 40 need not extend beyond the area of pedestal 12. The thickness of plate 22 would need to be adjusted so that the combined height of the pedestal 12 and the thickness of sealing plate 40 equals the thickness of plate 22. If plate 40 is provided as separate member and utilizes clamping in the assembly in order to seal and position, then holes 46 are coaxial with holes 26 found in plate 22 and with holes 48 found in manifold 50.

Manifold 50 preferably takes the form wherein the upper surface of manifold member 50 is relieved to form a chamber 52. Within chamber 52 a chimney 54 remains. Chimney 54 includes a passage 56 extending through and communicating with chamber 58 (FIG. 2) formed into the underside of manifold 50. Chambers 52 and 58 are separated by a divider 60 which includes a plurality of bosses 62 extending from the lower portion of divider 60. Bosses 62 correspond to the locations of and engage with plate 40, surrounding holes 42 which correspond with the supply conduits 17. Bosses 62 have a small restricter orifice or hole 64 therein to provide a flow resistance to the cooling fluid being supplied to the cold plate 8 for circulation. Restricter holes 64 insure that an adequate supply of cooling fluid is provided to all the supply conduits 17 under substantially equal pressure and that there are no supply conduits 17 which are starved for fresh coolant.

Overlying manifold 50 is top plate 70 having holes 72 around the periphery coaxial with clamping holes 48 found in manifold 50. Top plate 70 is provided with a supply hole 74 and a return hole 76. Return hole 76 aligns with return passage 56 in chimney 54.

Plate 40 serves the dual function of closing kerfs 14, 16 to form flow channels and completing a manifold in which the manifold comprises plate 40, divider 60, manifold 50 and top plate 70.

As cooling fluid is supplied through supply hole 74 in top plate 70, it enters chamber 52 and spreads throughout chamber 52 and passes into holes 68. Holes 68 terminate in restricter orifices 64 insuring that the entire chamber 52 will be filled with fluid and also will be maintained at a substantially uniform pressure. As the fluid flows through holes 68 and restricter orifices 64, the fluid then enters supply conduits 17.

Upon filling supply conduits 17, the fluid then flows along kerfs 14 and 16 to the next adjacent conduit, a return conduit 18. Upon entering the return conduit 18, the fluid then will flow into the chamber 58 because all kerfs communicating with conduit 18 will be supplying an inflow of fluid into conduit 18, thus forcing the fluid along conduit 18 into chamber 58. From chamber 58, the fluid is collected and permitted to flow through openings 56 and 76 to exit the cold plate 8.

Since fluid entering the supply conduit 17 need only flow past a single block 20, the flow of the fluid is relatively short, especially in the region where heat transfer is expected from block 20 to the fluid. Since the fluid flow length is limited to the length of one side of block 20, the fluid will not become inordinately warmed by block 20 during its passage and accordingly the temperature of the fluid at the supply conduit 17 will closely approximate the temperature of the fluid as it is collected in the return conduit 18.

Any warm spots in the vicinity of the return conduits 18 will be localized. The thermal conductivity of the copper will not permit a significant temperature gradient to be maintained. Accordingly, the cooling of the chips 80 or modules 80 will be very close to uniform. To further reduce the input/output differential temperature, the flow rate of coolant need only be increased to reduce residence time. With a small temperature differential between conduits 17 and 18 and a relatively high flow rate, it is possible to more uniformly cool all portions of block 20, thereby to more uniformly cool the electronic chips or modules 80 which are positioned in close proximity to plate 10.

Modules 80 are typically mounted upon a substrate 82 which provides the support and electrical connections for the modules 80. Interposed between the exposed surface of module 80 and the exterior surface of the plate 10 is a thin layer of oil 84 having a high thermal conductivity. The layer of oil 84 insures maximum conduction of heat from the module 80 to plate 10 and minimizes thermal interface resistance.

Figure 3:
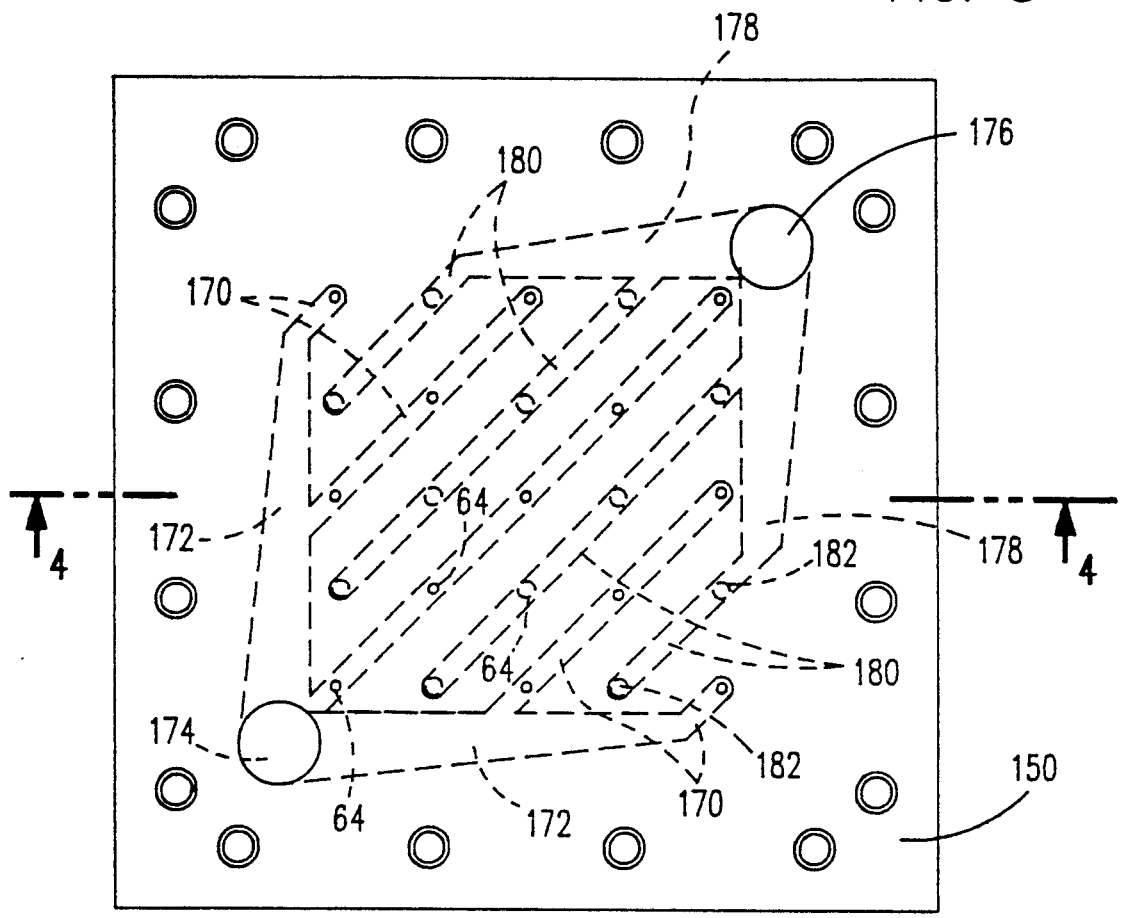
FIG. 3 is a view of the top of a cold plate assembly incorporating a distribution and collection manifold.
Figure 4:
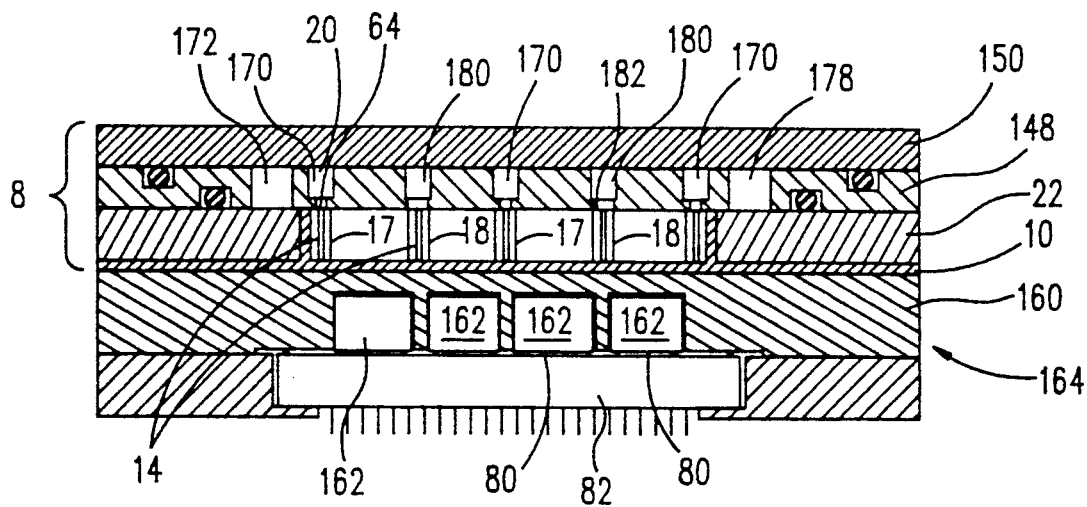
FIG. 4 is a sectional view along line A—A of FIG. 3.

Referring to an alternate embodiment, as shown in FIGS. 3 and 4, a top plate 150 is shown which has a supply opening 174 and a return opening 176 formed therethrough. Supply opening 174 communicates with channels 172 which are formed into manifold plate 148 as can best be seen in FIG. 4. Channels 172 act to distribute the cooling fluid to supply finger channels 170. Supply finger channels 170 in turn have restricter orifices 64 formed extending through the remaining portion of plate 148 to communicate with supply conduits 17.

Figure 2:
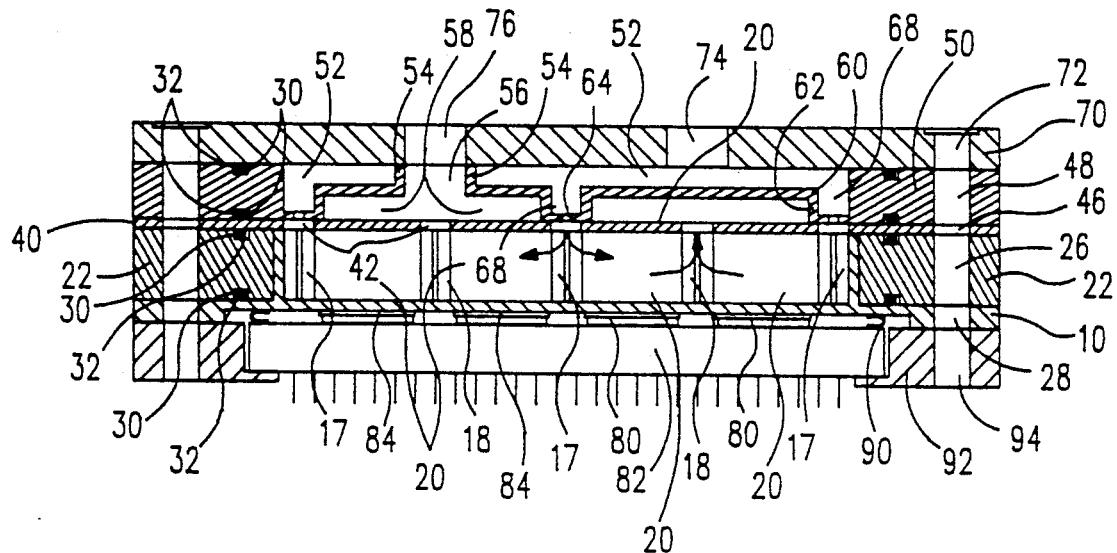
FIG. 2 is a sectional view of the assembled cooling assembly plate of FIG. 1.

The formation of supply conduits 17 and return conduits 18 and their placement within plate 10 is fully analogous to the corresponding conduits of plate 10 in FIGS. 1 and 2. Likewise, blocks 20 are separated by kerfs 14, as shown, and kerfs 16, not shown in FIG. 4. Return opening 176 communicates with return channels 178 which in turn communicates with return finger channels 180. Return finger channels 180 communicate, through openings 182 of a substantially larger diameter than restricter orifices 64, with the return conduits 18. Analogous to the arrangement in FIGS. 1 and 2, the restricter orifices 64 insure that a sufficient supply of cooling fluid introduced through supply opening 174 is distributed throughout the distribution channels 172, 170 to all orifices 64 and supply conduits 17. Likewise the larger openings 182 in the return finger channels 180 insure that the warmed fluid may flow easily and unrestricted into the return collection channels 178 and subsequently out through return opening 176.

Cold plate 8, as illustrated in FIG. 4, may be juxtaposed with plate 160 which in turn contains pistons 162. Pistons 162 are in turn engageable with electronic modules 80 supported by a ceramic substrate 82. The heat generated by electronic modules 80 is absorbed by pistons 162 and conveyed by conduction through plate 160 to the interface with plate 10 of the cold plate 8. Once the heat passes the interface between plate 160 and cooling plate 10, the heat then is conducted into blocks 20 and dissipated as previously described with respect to FIGS. 1 and 2.

FIG. 4 illustrates an arrangement where the cold plate 8 is separable from the thermal conduction module 164 comprising plate 160 and pistons 162. The thermal conduction module 164 comprised of plate 160 and pistons 162 may be of the type described in the related application identified above.

The advantage to this arrangement is that the thermal conduction module 164, together with the electronic modules 80 and module support 82, may be removed for servicing or rework without disturbing the cold plate 8 and the associated plumbing connected therewith.

Figure 5:
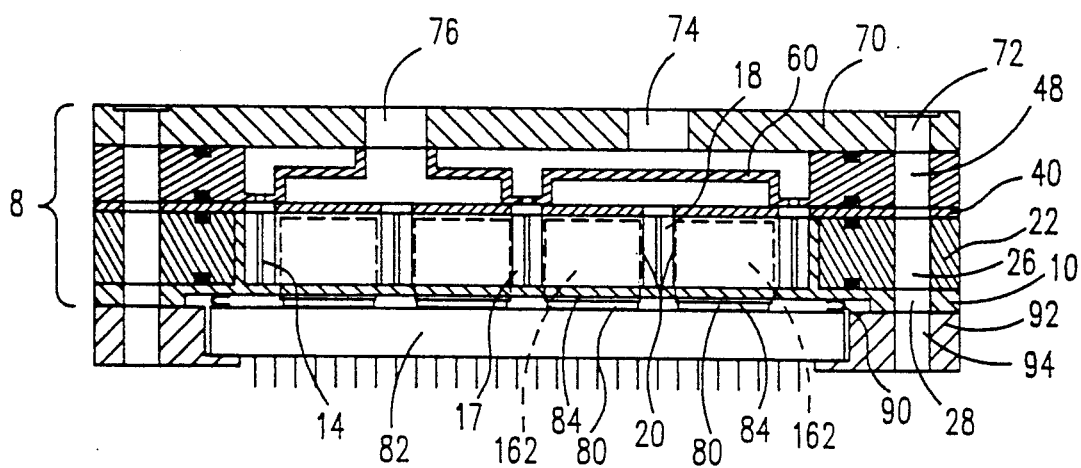
FIG. 5 illustrates an embodiment of the invention wherein pistons are contained within the blocks formed by intersecting kerfs in that the pistons are engageable with individual electronic modules to enhance heat transfer from said modules to the cooling plate.

An alternative embodiment where the flow network is integral to the thermal conduction module is illustrated in FIG. 5. The substantive differences between the embodiment illustrated in FIG. 5 and the embodiment illustrated in FIG. 2 are that blocks 20 are drilled or milled to form recesses into their interior, from the side of plate 10 which is exposed for engagement with electronic modules 80. The hollow blocks 20 thereby are adapted to accept and receive pistons 162. Pistons 162 may be of the type and installed as described in the above-identified related application. Piston 162 is disposed within block 20 and positioned to engage the top surface of electronic module 80, preferably with a thin coating of oil 84 interposed between module 80 and piston 162 in order to enhance the conduction of heat from electronic module 80 into piston 162 and, subsequently, into the walls of block 20.

Plate 40, when installed to close the top edges of kerfs 14, 16 and thereby forming channels that are contained, may be assembled using any of several techniques for sealing the plate 40 to the top surfaces of blocks 20. Previously described was a resilient coating of polymeric material which would serve as a gasket. An alternative to a coating would be a separate gasket layer positioned over blocks 20 prior to the installation of plate 40. Another alternative included precoating the surfaces of blocks 20 and of plate 40 which would mate using solder, and the reflowing of the solder precoat to rigidly assemble plate 40 to blocks 20 or braising of plate 40 onto the top surfaces of blocks 20. The plate 40 may not be required to extend to the edges of the overall cold plate assembly 8 if the plate 40 is adequately fixed and positioned within chamber 24 and on top of blocks 20 of plate 10.

Bolts, not shown, may be inserted through holes 72, 48, 26 and 94 to force the different layers of the cold plate assembly 8 and clamping ring 92 together, thereby forming seals at gasket 90. When the clamping ring 92 is forced upward toward plate 10, ceramic substrate 82 is likewise forced upward compressing gasket 90, thereby preventing the escape of any of the thermally conductive oil 84 which may have been squeezed out of the interface between modules 80 and plate 10 or pistons 162 as appropriate. It should be understood that other clamping techniques may be equally satisfactory.

Figure 6:
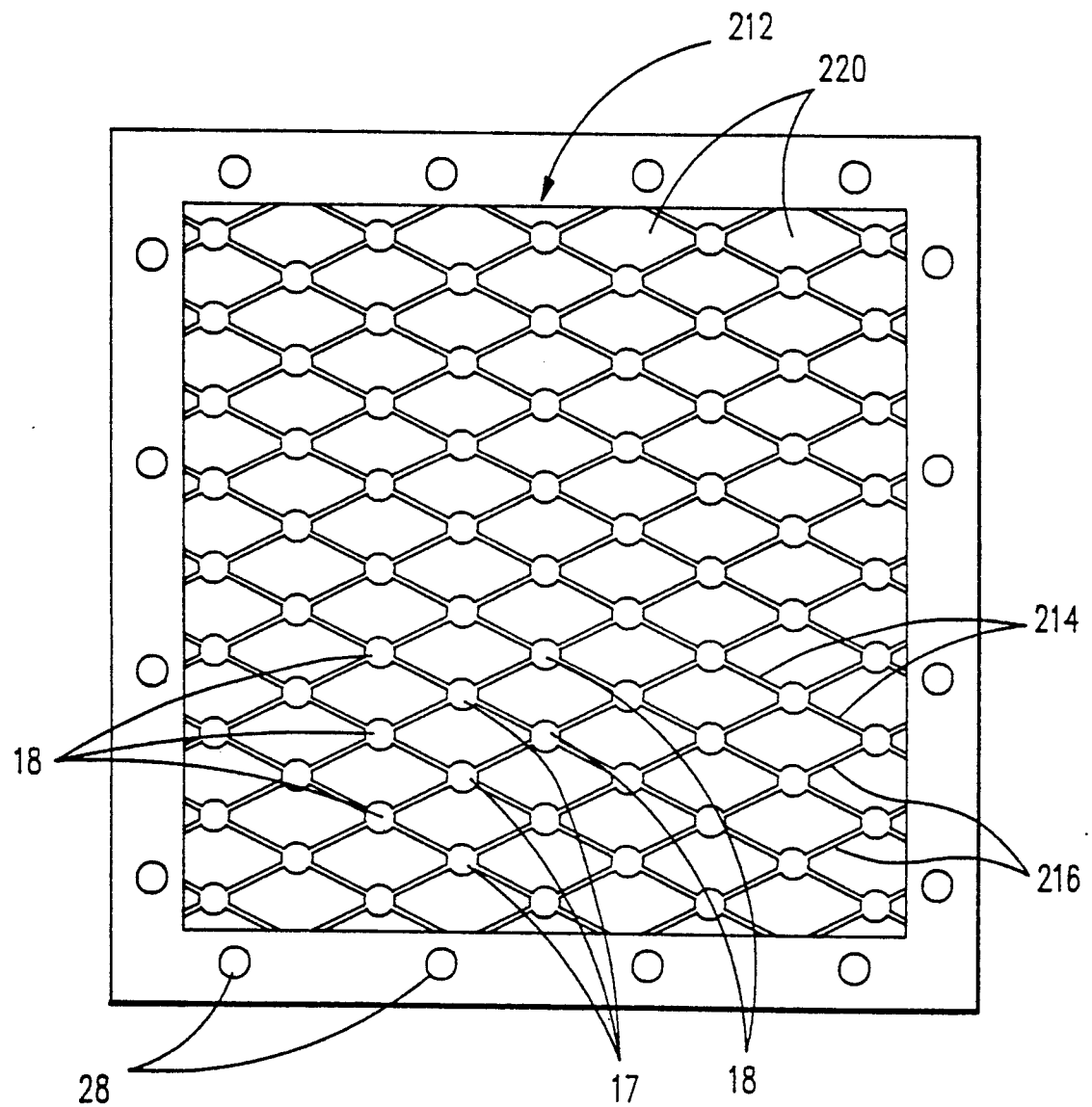
FIG. 6 illustrates an oblique intersecting flow channel pattern which may be used in the cooling plate of a cold plate assembly.

An alternative flow network which utilizes the same principles is the intersecting flow channels 214, 216 of FIG. 6. Orientation of the channels 214, 216 obliquely to each other may be utilized.

The supply conduits 17 and return conduits 18 are displaced relatively to adjacent conduits 18, 17 to form parallelpipeds 220 rather than the cubical structures 20 of FIG. 1.

The changes to the remaining parts of the cold plate 8 are dimensional changes to position passages to communicate with the conduits 17, 18 and need not be separately illustrated.

The most significant difference between the orthogonal layout of FIG. 1 and the oblique layout of FIG. 6 is that the heat transfer surface areas in the pedestal 212 of the oblique layout provide approximately the same effective heat transfer are with a reduced number of conduits 17, 18. This permits the flow rate to the cold plate 8 to be reduced.

Flow channel lengths may be judiciously increased or decreased by controlling the intersecting angles between kerfs or channels 14, 16 to further control the conduit count without serious degradation of the cooling capabilities of the cold plate 8.

Since the only portions of the assembly that conduct heat are the plate 10 and the pistons 162, if used, the remainder of the assembly may be made of materials and using techniques which are not dictated by metal. The manifold 50, seal plate 40, framing plate 22 and top plate 70 may all be manufactured of thermally insulative materials such as plastics, permitting molding of the parts and assemblies.

The details of the formation and installation of pistons 162 are not described in this application inasmuch as they form the subject matter of the related application identified above.

It will be apparent that the intersecting flow network disclosed and claimed herein may be used with other devices and techniques for the conveyance of heat from warm electronic devices to the cold plate 8 and ultimate transfer to the cooling fluid which flows through the various channels and conduits of the cold plate 8.

Other minor modifications and changes may occur to one of skill in the art and may be made without the removal of that implementation from the scope of the claims to follow.

We claim:

1. A cold plate for cooling a structure engageable with said cold plate by conduction, said cold plate comprising:
    a plate of highly heat conductive material having a first surface for engagement with a structure to be cooled, said first surface substantially planar in form;
    a second surface of substantially planar form, spaced from said first surface;
    a plurality of edge surfaces extending between said first and said second surfaces, defining said plate;
    a plurality of flow channels formed into said plate and having directions of flow substantially parallel to said first surface of said plate forming a plurality of intersections;
    a plurality of supply and return conduits formed into said plate and each of said conduits having an axis extending from said second surface and toward said first surface and further intersecting said flow channels at said intersections,
    whereby said flow channels may be supplied a cooling fluid through selected ones of said conduits and said cooling fluid may be collected at and conducted away from said channels through others of said conduits.

2. The cold plate of claim 1 further comprising a manifold disposed overlying and engaged with said second surface, said manifold comprising at least a first flow connection interconnecting a supply of cooling fluid and said selected ones of said conduits and at least a second flow connection interconnecting said others of said conduits, whereby cooling fluid may be provided to said selected ones of said conduits through one of said flow connections.

3. The cold plate of claim 1 wherein said channels intersect at substantially right angles and said conduits intersect said channels at said intersections at substantially right angles to said channels.

4. The cold plate of claim 1 wherein said channels have axes of flow and intersect at substantially right angles and said conduits intersect said channels at said intersections at substantially right angles to said axes of flow of said channels.

5. The cold plate of claim 1 wherein said conduits are disposed and selected to position a return conduit adjacent t and in flow communication with each supply conduit and connected to said supply conduit by one of said channels and displaced from said supply conduit by the length of said connecting channel.

6. The cold plate of claim 5 wherein each of said supply conduits is connected only to return conduits by said channels intermediate adjacent conduits.

7. The cold plate of claim 5 wherein said supply conduits are circumscribed by and connected to a plurality of said return conduits and each of said return conduits is circumscribed by and connected to a plurality of said supply conduits.

8. The cold plate of claim 2 wherein said manifold comprises at least a pair of interdigitated flow connections, each of said flow connections communicating with at least one of said conduits and all communications of each of said flow connections communicating with conduits of a same kind of conduit.

9. The cold plate of claim 8 wherein said manifold comprises:
- a first flow connection comprising a flow pattern comprising a plurality of flow branches, each of said branches communicating with at least one of said conduits;
- a second flow connection comprising a flow pattern comprising at least one flow branch, each said branch communicating with at least one of said conduits;
- one of said first and said second flow connections connected to a supply of cooling fluid and the other of said first and said second flow connections connected to said return conduits to collect and remove said cooling fluid from said cold plate through said other of said flow connections.

10. A cold plate for cooling a structure engageable with said cold plate by conduction, said cold plate comprising:
- a plate of highly heat conductive material having a first surface of substantially planar form;
- a second surface of substantially planar form, spaced from said first surface and substantially co-extensive with said first surface;
- a plurality of edge surfaces extending between said first and said second surfaces, defining said plate;
- a plurality of intersecting flow channels formed into said plate and defining a direction of flow substantially parallel to said first surface of said plate forming a plurality of intersections;
- a plurality of supply and return conduits formed into said plate and each of said conduits having an axis extending from said second surface and toward said first surface and further intersecting said flow channels at said intersections;
- said first surface interrupted by recesses formed into said plate and disposed intermediate and circumscribed by said channels, said recesses containing means for engaging and conduction, said means for engaging and conduction further engageable with a structure to collect and conduct heat from said structure into said members for further conduction to said cooling fluid,
- whereby said flow channels may be supplied a cooling fluid through selected ones of said conduits and said cooling fluid may be collected at an conducted away from said channels through others of said conduits.

11. The cold plate of claim 10, wherein said channels comprise a plurality of kerfs disposed to form a pattern of orthogonal channels and said conduits comprise a plurality of blind holes disposed at intersections of said kerfs.

12. The cold plate of claim 11 wherein selected ones of said conduits are connected to communicate with a supply of cooling fluid and remaining ones of said conduits communicate with a return connection for conveying said fluid out of said plate after passing through said channels.

13. The cold plate of claim 11 further comprising a manifold comprising at least one chamber communicating with an inlet and said supply conduits and a second chamber communicating with said return conduits and an outlet, for distributing said cooling fluid to said supply conduits and collecting said fluid after passage through said channels and exhausting said fluid form said plate.

14. A cold plate comprising:
- a plate of highly heat conductive material, said plate having formed into one face thereof a first plurality of grooves and a second plurality of grooves said first and second plurality of grooves forming channels and said first plurality of grooves disposed to orthogonally intersect said second plurality of grooves forming intersections;
- a plurality of conduits extending from said one face into said plate and disposed at said intersections and communicating with said grooves;
- a manifold comprising a supply passage and a return passage, said supply passage communicatively connected to selected ones of said conduits, and said return passage communicatively connected with others of said conduits, said connections disposed in a pattern whereby each conduit connected to said supply passage is circumscribed by and communicatively connected by said grooves to said conduits connected to said return passage and conduits connected to said return passage are circumscribed by and communicatively connected by said grooves to said conduits connected to said supply passage, whereby said conduits connected to said supply passage alternate with said conduits connected to said return passage along said grooves.

15. The cold plate of claim 14 wherein said manifold is disposed to engage said plate and close said grooves extending to said one surface, thereby forming closed channels each of which only connects with two of said conduits and disposed t intersect at least a further channel forming an intersection at said conduit.

* * * * *